Dec. 2, 1969 H. A. KLASENS 3,481,031
METHOD OF PROVIDING AT LEAST TWO JUXTAPOSED CONTACTS
ON A SEMICONDUCTOR BODY
Filed April 11, 1967 2 Sheets-Sheet 1

INVENTOR.
HENDRIK A.KLASENS
BY
Frank R. Trifari
AGENT

Dec. 2, 1969 H. A. KLASENS 3,481,031

METHOD OF PROVIDING AT LEAST TWO JUXTAPOSED CONTACTS ON A SEMICONDUCTOR BODY

Filed April 11, 1967 2 Sheets-Sheet 2

INVENTOR.
HENDRIK A. KLASENS
BY
Frank R. Trifari
AGENT

United States Patent Office 3,481,031

Patented Dec. 2, 1969

3,481,031

METHOD OF PROVIDING AT LEAST TWO JUXTAPOSED CONTACTS ON A SEMICONDUCTOR BODY

Hendrik Anne Klasens, Emmasingel, Eindhoven, Netherlands, assignor, by mesne assignments, to U.S. Philips Corporation, New York, N.Y., a corporation of Delaware Filed Apr. 11, 1967, Ser. No. 630,012

Claims priority, application Netherlands, Apr. 14, 1966, 6604962

Int. Cl. H01l 7/00

U.S. Cl. 29—571 8 Claims

ABSTRACT OF THE DISCLOSURE

A method of making a photoresistor or field effect transistor in which a photoresist mask is provided on a semiconductor layer and then the surface subjected to electron or ion bombardment to form electrode receiving areas on opposite sides of the mask and spaced apart by the width of the mask.

The invention relates to a method of providing two or more juxtaposed electrodes on a surface of a semiconductor body which preferably consists of a sulphide or selenide of cadmium or zinc or of a mixed crystal of sulphides or selenides of cadmium or zinc.

The invention further relates to a semiconductor device manufactured by the use of the method according to the invention.

Such a method is used inter alia in the manufacture of photosensitive semiconductor cells and photoresistors. In this manufacture it is necessary to provide a semiconductor surface with electrodes which make a good ohmic contact with the semiconductor material which usually consists of sulphide or selenides of cadmium or zinc or of mixed crystals of the said compounds.

In order to obtain very sensitive photoelectric cells it is also desirable to provide the surface with electrodes at a small mutual distance. It has appeared in practice that providing electrodes which are very closely located side by side, for example, in the form of vapour-deposited metal layers, with the desired electric properties often presents difficulties.

It is the object of the invention to provide a method in which electrodes can be provided in a simple manner on the said semiconductor materials with the desired configuration and properties.

The invention is based on the recognition of the fact that by a suitable combination of a photolithographic method and an ion or electron bombardment readily conducting, mutually separated surface layers can be formed in a semiconductor body in which even a very small mutual distance can be achieved and in which said layers, after providing a contact, show very favourable electric properties, for example, form ohmic connections.

For that purpose, according to the invention, in a method of the type described in the preamble a mask of a photohardening lacquer is provided on the semiconductor surface by using a photolithographic method, said mask leaving uncovered at least two regions of the surface which are separated from one another by the photohardening lacquer, the semiconductor surface being then subjected to an ion or electron bombardment as a result of which the uncovered regions of the surface become more strongly conductive, electrodes being then provided on said more strongly conductive regions. The regions of the semiconductor surface located below the hardened photolacquer are not exposed to the ion or electron bombardment so that readily conducting contact layers at mutually very small distance can be realized at the surface, which contact layers may then be provided with contacts, if desired, at places located farther away from one another. The additional advantage is obtained that an ohmic contact can be formed on said contact layers with metals, for example, gold and platinum, which are particularly suitable as electrode materials as a result of their low resistivity and corrosion resistance but which do not form an ohmic contact with the said semiconductor materials as such.

After the ion or electron bombardment current supply wires may be provided on the bombarded regions of the surface, for example, by means of thermo-compression bonding. According to an important preferred embodiment of the method according to the invention, however, an electrode layer is provided on the semiconductor surface after the electron or ion bombardment, the mask with the parts of the electrode layer located thereon being removed. In this manner, after masking the semiconductor surface, the ion or electron bombardment and the provision of the electrodes, for example, by vapour-deposition, may be carried out immediately after each other without removing the semiconductor body from the treatment space.

Many metals or alloys may be used as electrode materials. However, electrodes consisting of gold, platinum or a nickel-chromium alloy are advantageously used inter alia with a view to the resistance against chemical influences and in connection with the favourable conductivity properties.

The method according to the invention is particularly advantageously applied to a semiconductor body consisting of cadmium sulphide which shows very favourable photoconductive properties.

The use of an ion bombardment is preferably effected in the form of a gas discharge between the semiconductor body and a further electrode, which gas discharge may take place, for example, in the same vacuum plant in which the electrodes are subsequently vapour-deposited on the semiconductor surface.

Any commercially available photoresist may be used as a photohardening lacquer. A photoresist is to be understood to mean herein the photochemical substance normally used in photolithographic methods. In this connection there is to be distinguished between a negative photoresist—which, by a photochemical process, is selectively hardened at the exposed places and becomes insoluble in the associated developer and remains soluble at the unexposed places—and a positive photoresist—which, by a photochemical process, becomes soluble selectively at the exposed places in the associated developer and remains insoluble at the unexposed places.

In the method according to the invention a positive photoresist may advantageously be used as photohardening lacquer, for example, "Kalle Kopierlack PIRE 2327/50," obtainable from Kalle A.G., Wiesbaden, Germany. In circumstances a negative photoresist may alternatively be used to advantage, for example "Kodak Photo Resist" (KPR).

The invention is of particular advantage for the manufacture of a photoresistor in which two juxtaposed ohmic contacts are provided on a photoconductive semiconductor body.

According to another preferred embodiment the method according to the invention is used to manufacture a field-effect transistor in which a source and drain electrode are provided on a semiconductor body and a gate electrode is provided on the semiconductor body between the source and drain electrode.

The invention further relates to a semiconductor device employing a semiconductor body on which two or more juxtaposed electrodes are provided by using the method according to the invention.

In order that the invention may readily be carried into effect a few embodiments thereof will now be described in greater detail, by way of examples with reference to the accompanying drawings, in which FIGURE 1 is a plan view of a photoresistor manufactured by the use of the method according to the invention.

Figure 1:
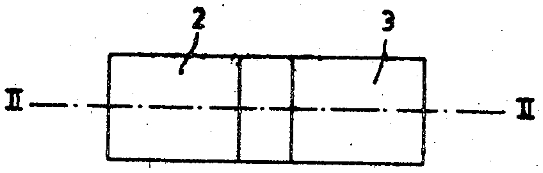
Figure 2:
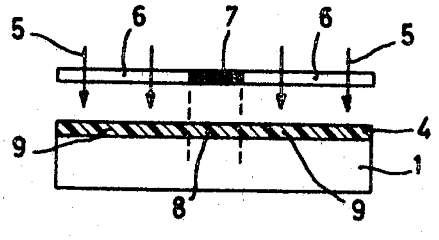
FIGURES 2 to 5 are diagrammatic cross-sectional views taken on the line I—I of the photoresistor as shown in FIGURE 1 in successive stages of manufacture.

FIGURE 1 is a plan view of a photoresistor in which on a surface of a semiconductor body 1 (see FIGURE 2) consisting of cadmium sulphide two electrodes 2 and 3 are provided beside each other.

For that purpose, the starting material is a plate 1 consisting of high-ohmic n-type cadmium sulphide activated with $10^{-3}$–$10^{-4}$% by weight of copper and gallium.

Figure 3:
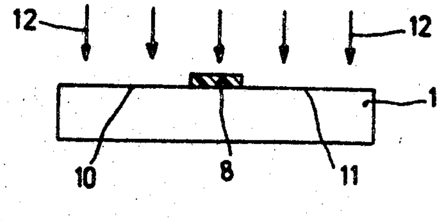

A layer 4 consisting of a positive photoresist, for example "Kalle Kopierlack PIRE 2327/50," obtainable from Kalle A.G., Wiesbaden, Germany, is provided on this plate. This photoresist layer is exposed to light in the direction of the arrows 5 (FIGURE 3) through a mask (6, 7) with transparent parts 6 and a light-impervious part 7, the exposed parts 9 (FIGURE 2) of the photoresist layer 4 becoming soluble while the unexposed strip-like part 8 remains insoluble in an associated developer.

After removing the parts 9 which have become soluble a mask 8 of photo-hardening lacquer is formed on the semiconductor surface (see FIGURE 3) which mask leaves two regions 10 and 11 (FIGURE 3) of the surface which are separated by the photo-hardening lacquer 8 uncovered.

Subsequently an ion-bombardment is applied to the surface of the cadmium sulphide in the direction of the arrows in the form of a gas discharge in a vacuum chamber. The layer is placed on a metallic support which is situated at a distance of about 10 cm. from a metallic electrode with a surface of about 100 $cms.^2$. The chamber is then evacuated and the electrode is biased positively at about 1 kv. with respect to the support. Then a gas as for instance argon, oxygen or nitrogen is admitted by means of a needle valve, so that a gas discharge is established in which the positive gas ions hit the cadmium sulphide layer. The pressure is regulated so that a discharge current of about 50 ma. is maintained; this pressure may be of the order of 0.2 mm. The ion-bombardment is carried out for about 4 minutes. This ion-bombardment may be substituted by an electron-bombardment, for instance by inversion of the polarities of the said support and the said electrode. Because of the difference in mass between ions and electrons, in order to obtain the same effect an electron-bombardment should be carried out for a time or at a current which are 5 to 10 times superior to those required for an ion-bombardment. The nature of the employed gases and the above-mentioned parameters are not critical. As a result of this bombardment the uncovered regions 10 and 11 of the surface become more strongly conductive. Because of the fact that the photoresist mask immediately adjoins the semiconductor surface, the bombarded region may very sharply be defined so that the strongly conductive regions 10 and 11 may have a very small mutual distance.

Figure 4:
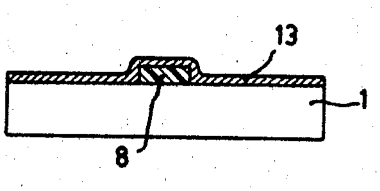
Figure 5:
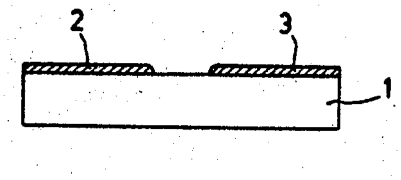
Figure 6:
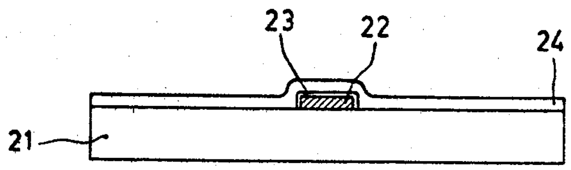
FIGURES 6 to 9 are diagrammatic cross-sectional views of a field-effect transistor manufactured with the use of the method according to the invention.
Figure 7:
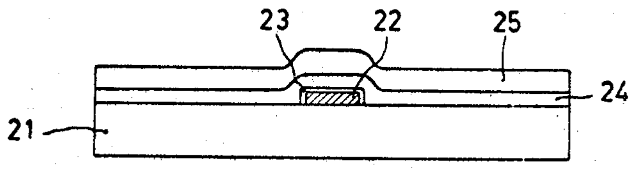
Figure 8:
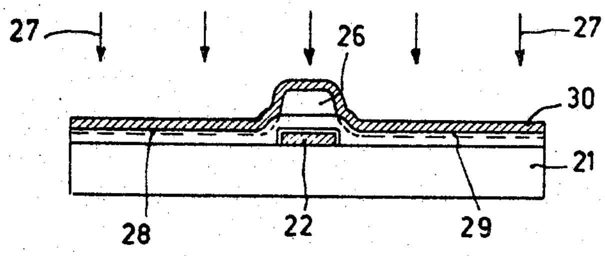
Figure 9:
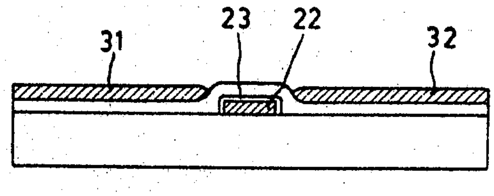

Electrodes are then provided on the more strongly conductive regions 10 and 11. For that purpose (see FIGURE 4) the semiconductor surface is provided, for example, by vapour-deposition, with a layer of gold 13, 500 A. thick, an ohmic contact being formed on the more strongly conductive regions 10 and 11 of the surface. The photoresist strip 8 with the part of the layer of gold provided thereon is then removed, for example, by means of acetone which penetrates through the pores in the layer of gold 13 as a result of which (see FIGURE 5) a photoresistor is obtained having two juxtaposed electrodes 2 and 3.

In FIGURES 6 to 9 is shown the manufacture of a field-effect transistor by using the method according to the invention. In this method a strip of aluminium 22,600 A. thick, is provided on a glass substrate 21 by means of photoresist methods. This aluminium strip 22 is then coated with an insulating layer 23 of $Al_2O_3$, approximately 200 A. thick, by anodic oxidation after which a layer 24 of high ohmic n-type cadmium sulphide, $0.1\mu$ thick is vapour-deposited on the assembly.

A positive photoresist layer 25 is then provided on this cadmium sulphide layer 24 (see FIGURE 7) which provides, as in the preceding example, a photoresist strip 26 (see FIGURE 8) located above the aluminium strip 22 by exposure to light through a suitable mask and removing the resist which has become soluble in a developer.

It is to be noted in this connection that, if the layer 24 transmits light, which is the case, for example, when tin oxide is used as the semiconductor, the photoresist layer 25 may be exposed advantageously through the glass substrate 21, the gate electrode 22 serving as a mask.

This photoresist mask 26 serves as a mask in the subsequent gas discharge in the direction of the arrows 27 which is carried out again in a manner analogous to that of the preceding example. In this case strongly conductive surface parts 28 and 29 are formed in the uncovered regions of the cadmium sulphide. The whole surface is then provided, by vapour-deposition, with a layer 30 of gold 500 A. thick. An ohmic contact is formed on the uncovered parts of the surface. After removing the photoresist 26 with the part of the layer of gold provided thereon, two juxtaposed electrodes 31 and 32 are formed (see FIGURE 9).

Figure 10:
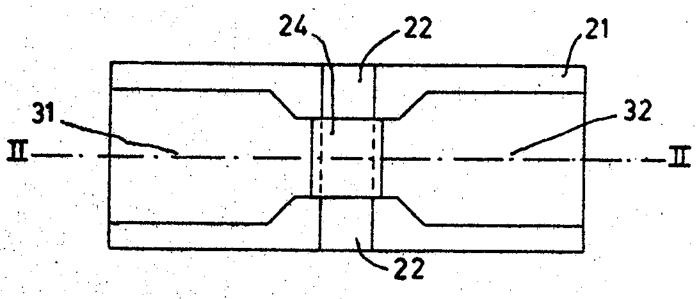
FIGURE 10 is a plan view of the field-effect transistor which is shown in cross-section in FIGURES 6 to 9 taken on the line II—II For clearness' sake the figures are not drawn to scale in particular where the layer thicknesses are concerned.

In this manner a field-effect transistor is obtained in which a current source and drain electrode (31 and 32) are provided on a semiconductor body 24 and in which a gate electrode (22, 23) consisting of an aluminium electrode 22 is provided between the source and drain electrode by means of an insulating layer 23 on the semiconductor body 24. It will be obvious that the aluminium strip 22, for being provided with contacts, must be left partly uncovered by the cadmium sulphide layer 24, see the plan view of FIGURE 10, in which the part of the aluminium strip 22 bounded by the broken lines is located below the cadmium sulphide layer 24.

In addition it will be apparent that the method is not restricted to the examples described but that many variations are possible to those skilled in the art without departing from the scope of this invention. For example, instead of a positive photoresist a negative photoresist, for example, "Kodak Photo Resist" may alternatively be used in which the exposure mask (for example (6, 7) in FIGURE 2) must be inverted by replacing the non-transparent parts by transparent parts, and conversely. After the ion bombardment the contacting of the strongly conductive surface regions 10 and 11 may alternatively be effected by locally providing thermo-compression contacts instead of with an electrode layer. The electrode layer 13 may consist of other metals, in particular platinum or a nickel-chromium alloy, while the semiconductor body 1 may alternatively consist of other semiconductors instead of cadmium sulphide, for example, it may consist of other sulphides of selenides of zinc or cadmium or of their mixed crystals. In addition, instead of a gas discharge an electron bombardment may be used.

Finally it is to be noted that although the invention is of particular importance for providing ohmic contacts, the invention may alternatively be used in semiconductors in which ion bombardment produces inversion of the conductivity type in addition to an increase of the conductivity. This may be of importance, for example, for the manufacture of most-type transistors in which (see, for example, FIGURE 8) the surface layers 28 and 29 are source and drain electrodes of a conductivity type which is opposite to that of the remaining part of the layer 24.

What is claimed is:

1. A method of manufacturing a semiconductor device comprising spaced electrodes coupled to a semiconductor layer, wherein the semiconductor consists of a material selected from the group consisting of cadmium or zinc sulphides and selenides and mixed crystals thereof, comprising by means of a photolithographic method involving optical exposure through a light mask having opaque and transparent areas providing on a surface of and in contact with a semiconductor layer a mask of a photohardening lacquer in a thickness capable of blocking impinging ions or electrons leaving exposed semiconductor surface portions on opposite sides of the lacquer mask, subjecting the said lacquer mask and the said exposed surfaces of the semiconductor layer on opposite sides of the provided lacquer mask to ion or electron bombardment to modify the conductivity of the exposed semiconductor surface portions while the said photohardening lacquer mask blocks the underlying surface portions from receiving said bombardment, and providing on the said surfaces of modified conductivity and spaced from one another ohmic contacts to form said electrodes.

2. A method as claimed in claim 1, wherein characterized in that after the electron or ion bombardment an electrode layer is provided on the semiconductor surface after which the mask with the parts of the electrode layer provided thereon is removed.

3. A method as claimed in claim 1 wherein the electrodes consist of gold, platinum or a nickel-chromium alloy.

4. A method as claimed in claim 1 wherein an ion bombardment is used in the form of a gas discharge between the semiconductor body and a further electrode.

5. A method as claimed in claim 1 wherein characterized in that the photohardening lacquer is a positive or negative photoresist.

6. A method as claimed in claim 1 in the manufacture of a photoresistor, characterized in that two juxtaposed ohmic contacts are provided on a photoconductive semiconductor body.

7. A method as claimed in claim 1 in the manufacture of a field-effect transistor, characterized in that a source and drain electrode are provided on the semiconductor body, a gate electrode being provided on the semiconductor body between the source and drain electrode.

8. A method of manufacturing a semiconductor device comprising at least one field-effect transistor having source, drain and gate electrodes coupled to a semiconductor layer of sulphides, selenides or mixed crystals thereof, comprising providing on a substrate an insulated gate electrode and over the latter a layer of semiconductive material, by means of a photolithographic method involving optical exposure through a light mask having opaque and transparent areas providing on a surface of the semiconductor layer remote from the substrate and in contact with the semiconductor a photohardening lacquer mask in a thickness capable of blocking impinging ions or electrons leaving exposed semiconductor surface portions on opposite sides of the lacquer mask, subjecting the said lacquer mask and the said exposed surfaces of the semiconductor layer on opposite sides of the lacquer mask within a chamber to ion or electron bombardment until the said exposed surfaces exhibit increased conductivity while the said lacquer mask blocks the underlying surface portions from receiving said bombardment, within the same chamber vapor-depositing on the said surfaces of increased conductivity ohmic contacts of a material selected from the group consisting of gold, platinum and nickel-chromium alloy to form source and drain contacts, and removing the lacquer mask and any deposited material thereon.

References Cited

UNITED STATES PATENTS

| | | | |
|---|---|---|---|
| 2,563,503 | 8/1951 | Wallace. | |
| 2,588,254 | 3/1952 | Lark-Horovitz et al. | 29—572 X |
| 2,735,948 | 2/1956 | Sziklai | 29—577 X |
| 2,787,564 | 4/1957 | Shockley | 148—1.5 |
| 2,981,877 | 4/1961 | Noyce | 317—235 |
| 2,989,385 | 6/1961 | Gianola et al. | |
| 3,298,863 | 1/1967 | McCusker | 29—584 |

PAUL M. COHEN, Primary Examiner

U.S. Cl. X.R.

29—578, 579, 589, 620

UNITED STATES PATENT OFFICE

CERTIFICATE OF CORRECTION

Patent No. 3,481,031 December 2, 1969

Hendrik Anne Klasens

It is certified that error appears in the above identified patent and that said Letters Patent are hereby corrected as shown below:

Column 5, lines 31 and 32, cancel "character-ized in that"; lines 42 and 43, cancel "character-ized in that".

Signed and sealed this 18th day of August 1970.

(SEAL)
Attest:

Edward M. Fletcher, Jr.
Attesting Officer

WILLIAM E. SCHUYLER, JR.
Commissioner of Patents